United States Patent
Hsu et al.

(10) Patent No.: US 6,404,234 B1
(45) Date of Patent: Jun. 11, 2002

(54) VARIABLE VIRTUAL GROUND DOMINO LOGIC WITH LEAKAGE CONTROL

(75) Inventors: Steven K. Hsu, Lake Oswego; Sanu K. Mathew, Hillsboro; Ram K. Krishnamurthy, Portland, all of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/851,917

(22) Filed: May 9, 2001

(51) Int. Cl.[7] ............................................. H03K 19/096

(52) U.S. Cl. ............................. 326/93; 326/95; 326/98; 327/208

(58) Field of Search ............................... 326/93, 95–98; 327/208–212, 214, 215, 224, 225

(56) References Cited

U.S. PATENT DOCUMENTS

| | | | |
|---|---|---|---|
| 4,571,510 A | 2/1986 | Seki et al. ................... | 307/449 |
| 4,697,109 A | 9/1987 | Honma et al. ............... | 307/475 |
| 4,899,066 A | 2/1990 | Aikawa et al. ............. | 307/45.2 |
| 5,115,150 A | 5/1992 | Ludwig ....................... | 307/475 |
| 5,258,666 A | 11/1993 | Furuki ......................... | 307/449 |
| 5,453,708 A | 9/1995 | Gupta et al. ................. | 326/98 |
| 5,543,735 A | 8/1996 | Lo ............................... | 326/93 |
| 5,568,062 A | 10/1996 | Kaplinsky .................... | 326/27 |

(List continued on next page.)

FOREIGN PATENT DOCUMENTS

| | | | |
|---|---|---|---|
| EP | 0954101 | 3/1999 | ......... H03K/19/096 |
| JP | 04-239221 | 8/1992 | ......... H03K/19/096 |

OTHER PUBLICATIONS

Bryant, R.E., "Graph–Based Algorithms for Boolean Function Manipulation", *IEEE Transactions on Computers*, C–35 (8), pp. 677–691, (1986).

Chakradhar, S.T., et al., "An Exact Algorithm for Selecting Partial Scan Flip–Flops", Proceedings of the 31st Design Automation Conference, San Diego, California, pp. 81–86, (1994).

Chakravarty, S., "On the Complexity of Using BDDs for the Synthesis and Analysis of Boolean Circuits", *27th Annual Allerton Conference on Communication, Control, and Computing*, Allerton House, Monticello, Illinois, pp. 730–739, (1989).

Patra, P., et al., "Automated Phase Assignment for the Synthesis of Low Power Domino Circuits", Proceedings of the 36th ACM/IEEE Conference on Design Automation, pp. 379–384, (1999).

Puri, et al., "Logic Optimization by Output Phase Assignment in Dynamic Logic Synthesis", *International Conference on Computer Aided Design*, 7 p., (1996).

Thompson, S., et al., "Dual Threshold Voltages and Substrate Bias: Keys to High Performance, Low Power, 0.1 um Logic Designs", Symposium on VLSI Technology Digest of Technical Papers, pp. 69–70, (1997).

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

A domino logic circuit and method comprise at least two series-connected domino logic stages with each domino logic stage comprising a dynamic stage and a static stage. A variable virtual ground of the first domino logic's static stage is switched to a voltage level below a circuit ground level when a received clock signal and a second domino logic stage's dynamic output are both high, indicating the second domino logic circuit stage is in the evaluation phase.

22 Claims, 5 Drawing Sheets

U.S. PATENT DOCUMENTS

| | | | |
|---|---|---|---|
| 5,661,675 A | 8/1997 | Chin et al. | 364/768 |
| 5,671,151 A | 9/1997 | Williams | 364/489 |
| 5,748,012 A | 5/1998 | Beakes et al. | 326/93 |
| 5,796,282 A | 8/1998 | Sprague et al. | 327/210 |
| 5,815,005 A | 9/1998 | Bosshart | 326/95 |
| 5,825,208 A | 10/1998 | Levy et al. | 326/98 |
| 5,831,990 A | 11/1998 | Queen et al. | 371/22.1 |
| 5,852,373 A | 12/1998 | Chu et al. | 326/98 |
| 5,886,540 A * | 3/1999 | Perez | 326/93 |
| 5,889,417 A | 3/1999 | Klass et al. | 326/98 |
| 5,892,372 A | 4/1999 | Ciraula et al. | 326/96 |
| 5,896,046 A | 4/1999 | Bjorksten et al. | 326/98 |
| 5,896,399 A | 4/1999 | Lattimore et al. | 371/21.1 |
| 5,898,330 A | 4/1999 | Klass | 327/210 |
| 5,917,355 A | 6/1999 | Klass | 327/208 |
| 5,942,917 A | 8/1999 | Chappell et al. | 326/121 |
| 6,002,272 A * | 12/1999 | Somasekhar et al. | 326/98 |
| 6,002,292 A | 12/1999 | Allen et al. | 327/379 |
| 6,049,231 A | 4/2000 | Bosshart | 326/98 |
| 6,052,008 A | 4/2000 | Chu et al. | 327/200 |
| 6,060,910 A | 5/2000 | Inui | 326/98 |
| 6,087,855 A | 7/2000 | Frederick, Jr. et al. | 326/106 |
| 6,104,212 A * | 8/2000 | Curran | 326/95 |
| 6,108,805 A | 8/2000 | Rajsuman | 714/724 |
| 6,133,759 A | 10/2000 | Beck et al. | 326/98 |
| 6,204,696 B1 | 3/2001 | Krishnamurthy et al. | 326/98 |

* cited by examiner

US 6,404,234 B1

VARIABLE VIRTUAL GROUND DOMINO LOGIC WITH LEAKAGE CONTROL

FIELD OF THE INVENTION

The invention relates generally to semiconductor logic devices, and more specifically to domino logic circuitry having a variable virtual ground circuit operable to vary a virtual ground level of a static output circuit stage.

BACKGROUND OF THE INVENTION

Semiconductor operational frequencies are ever increasing, requiring circuitry and processes that support these faster clock rates. Domino circuits have been used in such circuits to speed processing, due to the way in which a domino logic circuit handles data. Domino circuits are often used in critical paths in processors and other digital logic, where low latency is an important design factor. A typical domino logic circuit receives data on a first transition of a clock, and couples a logically derived signal to external circuitry on a next transition of the clock.

A conventional domino circuit includes dynamic circuitry coupled to static gate circuitry. The dynamic circuitry precharges an input of the static circuitry high when a clock signal is low, and couples an input data signal to the static circuitry when the clock signal is high. The dynamic circuitry often is n-type metal oxide semiconductor (NMOS) pull-down circuitry, that is operable to pull down the level of a relatively weakly held pre-charged circuit node. The node is then latched in static CMOS circuitry to provide a stable output until the next logical cycle.

But, the speed of such logic is limited by the time it takes to pre-charge the dynamic circuit node that provides the data signal to the static CMOS latch and the output, and by the time it takes to pull down the weakly-held precharged node voltage to provide a low signal level to the static CMOS latch circuitry and to change the state of the output. Simply fabricating a larger keeper circuit will achieve the desired noise immunity, but at a greater delay due to the stronger level keeper circuit that must be overcome in the evaluation phase.

One solution to such problems is to reduce the physical size of the circuit elements and reduce the supply and threshold voltages within the circuit, resulting in physically smaller devices able to change state over a smaller voltage range more quickly. But, the reduced threshold voltages and smaller geometry result in high subthreshold and leakage current in the transistors. Also, the low threshold voltages coupled with faster signal edges and greater noise coupling due to smaller geometry contribute to increasingly substantial noise problems. Some high fan-in gates such as high fan-in dynamic NOR gates are particularly noise prone, and so benefit from a higher threshold voltage. A higher threshold voltage may be used to compensate for higher noise, but a circuit providing a lower threshold voltage with faster operation is desirable in many applications. As lower threshold devices are used, the resulting higher leakage leads to lower noise immunity.

For these reasons and others that will be apparent to those skilled in the art, need exists for a domino logic circuit that is operable at a low threshold voltage yet that retains an adequate noise margin.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Because domino logic circuits are typically employed in high-speed digital logic circuits, a need exists for domino logic circuits that provide for the fastest operational speeds as can be practically achieved. Such desired increases in speed can be realized by modifying a domino logic circuit to change states more quickly, such as by altering threshold points or otherwise altering the voltage swing needed to change states.

Figure 1:
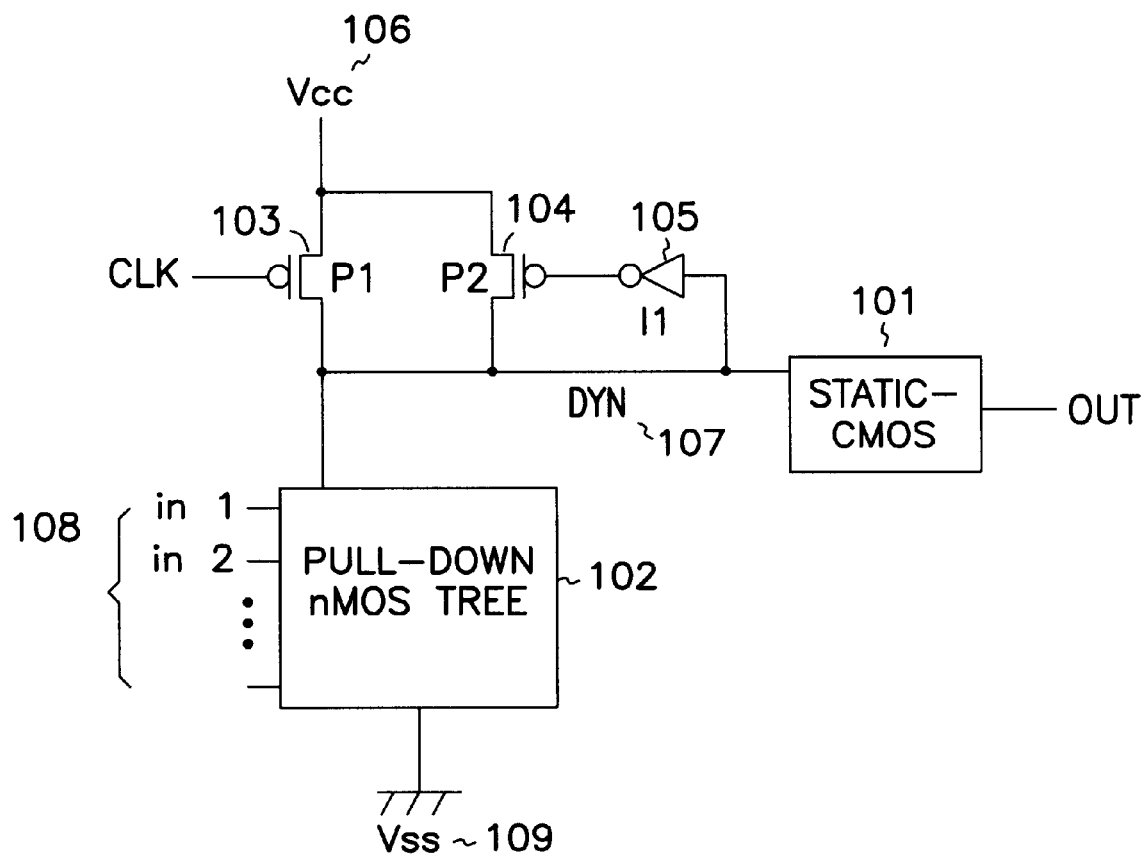
FIG. 1 shows a domino logic circuit, consistent with the prior art.

FIG. 1 illustrates a typical prior art domino logic circuit. The circuit consists essentially of three stages, including a static complementary metal-oxide semiconductor (CMOS) circuit 101, a dynamic precharge circuit, and a pull-down n-channel metal oxide semiconductor (NMOS) circuit 102. The dynamic precharge circuit typically consists of a p-channel transistor 103 that is coupled to a clock signal at its gate, and a second p-channel transistor 104 that is coupled to an inverter 105 output at its gate. Components 102–105 comprise the dynamic stage of the domino logic circuit, and element 101 represents the static stage.

Both p-channel transistors 103 and 104 are connected between a first voltage connection 106 and a dynamic output node 107, and the input of the inverter 105 is further connected to the dynamic output node 107. The dynamic output node is connected to the static CMOS circuit 101, and to the pull-down NMOS tree 102. The pull down NMOS tree 102 is further connected to one or more inputs 1 through n shown at 108, and to a second voltage connection 109. In some embodiments, p-channel transistor 104 has a relatively small channel width or other feature to reduce the current conducted by the transistor.

In operation, the p-channel transistor 103 conducts when the clock signal is low, charging dynamic output node 107 to approximately the voltage level of the first voltage connection 106. This stage is known as the precharge phase or reset phase, because the dynamic output node is charged to the voltage present at 106. When the clock signal goes high, the p-channel transistor 103 no longer conducts, and the voltage level at the dynamic output node 107 is maintained high by p-channel transistor 104.

Transistor 104 and inverter 105 form a level keeper portion of the circuit, and function to weakly maintain the present high voltage state of the dynamic output node 107 when the clock signal is high. Because the dynamic output node is at high voltage when the clock transitions from low to high, the dynamic output node high voltage signal is inverted by the inverter and turns the p-channel transistor 104 on, maintaining a connection between the first voltage connection 106 and the dynamic output node 107. P-channel transistor 104 is intentionally designed to be somewhat weak, or to have a low current when on, so that the dynamic output node can be driven toward the second voltage level despite the level keeper.

The pull-down NMOS tree 102 implements the logic portion of the circuit, and is connected between the dynamic output node and the second voltage connection 109. The pull-down NMOS tree either connects or does not connect the dynamic output node to ground, depending on the desired logical output. Therefore, the pull-down tree may be designed to implement any desired function, and determines the function of the whole domino logic circuit. If the pull-down NMOS tree is turned on and conducts between the second voltage connection 109 and the dynamic output node 107, the conduction to a low voltage level overcomes the high voltage connection via p-channel transistor 104 of the level keeper, forcing the dynamic output node to a low voltage state. The level keeper circuit then turns transistor 104 off, leaving the dynamic output node at a low voltage level.

After sufficient time has passed for the dynamic output node to change states from the first voltage level to the second voltage level if necessary, the dynamic output node signal provides a logical output signal representing the logic of the pull-down NMOS tree, and is input to a static CMOS circuit 101. The static CMOS circuit then provides a high or low voltage output, based on whether the dynamic output node 107 has a voltage level higher or lower than the threshold point of the static CMOS circuit. Adjustment or skew of the threshold point of the static CMOS circuit to a higher voltage level may be employed to reduce the time needed for the dynamic output node to cross the threshold point, substantially increasing the speed of the domino logic stage.

The time needed for the static CMOS circuit to change state after the clock signal transitions high is dependent on the time needed to pull the dynamic output node 107 down from its first voltage level to a voltage level below the threshold point Vt of the static CMOS circuit. In this circuit, the voltage swing must therefore be Vcc−Vt, or the high voltage connection voltage level minus the threshold voltage of the static CMOS circuit. The voltage threshold Vt is typically Vcc/2, meaning a voltage swing of one-half Vcc is necessary to change states. The threshold point Vt may be set higher than Vcc/2, to skew the threshold point. This permits the voltage of the dynamic output node 107 to change state from Vcc to Vcc−Vt more rapidly, and so provides faster operation. Such a modified circuit results in faster switching of the state of the dynamic output node, and faster CMOS static gate 101 reaction to the change in the dynamic output node state, but does so at the expense of noise immunity.

The present invention provides a domino logic circuit that reduces the time required to change the state of the output signal of a domino logic circuit to provide a faster overall signal propagation speed, and that is operable with a low threshold voltage, yet that provides an adequate noise margin. The present invention achieves this by variable virtual ground circuitry operable to vary a virtual ground level of a static output circuit stage, thereby underdriving the input of subsequent stages and reducing leakage current when the input transistor is off. The variable virtual ground circuit allows the use of low threshold devices without sacrificing noise immunity. This circuit therefore enables faster overall domino logic circuit operation than traditional domino logic using the same fabrication process, and therefore offers a desirable improvement over the prior art.

Figure 2:
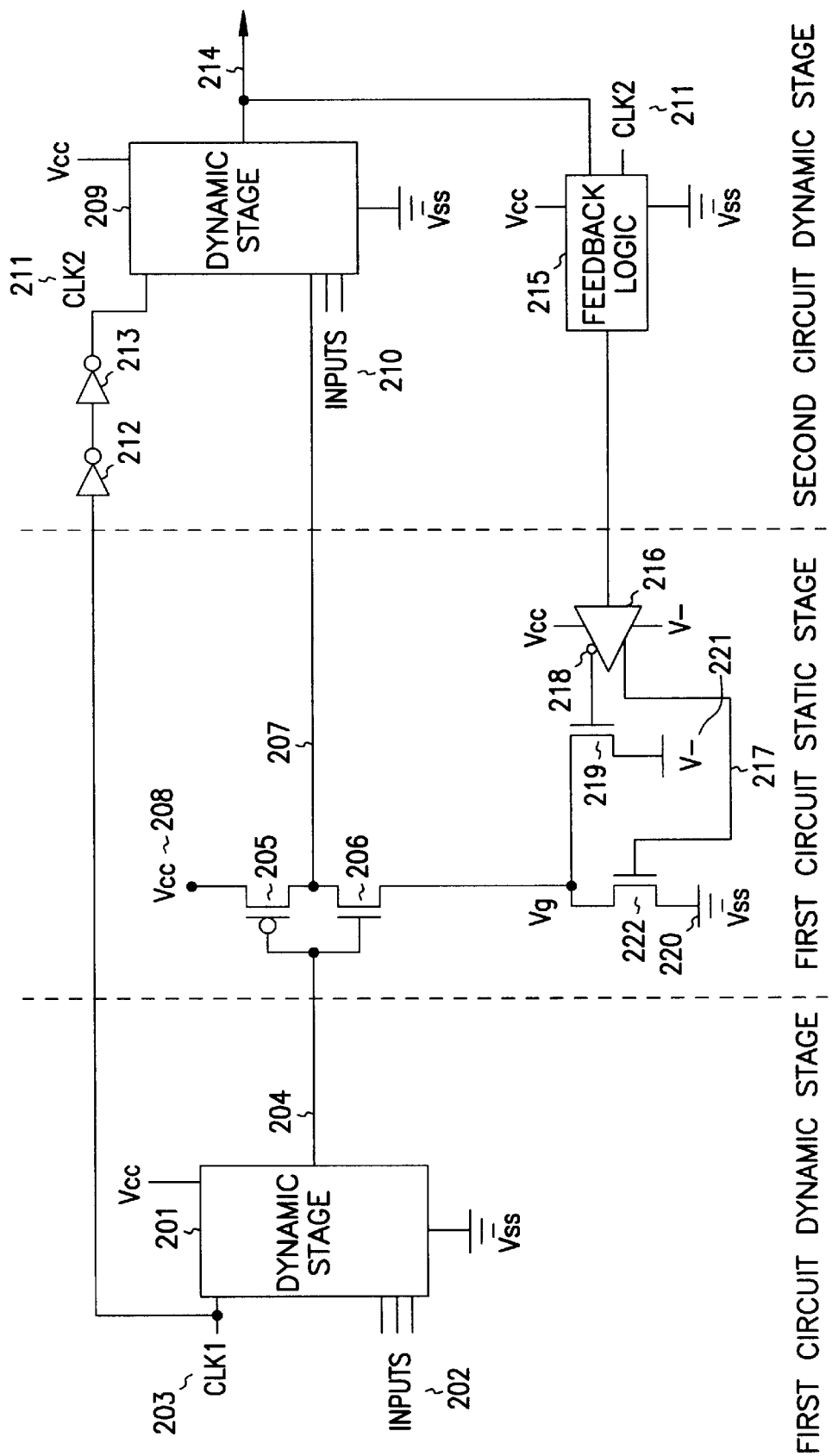
FIG. 2 shows a domino logic circuit including portions of a second domino circuit stage and a novel static stage variable ground, consistent with an embodiment of the present invention.

FIG. 2 is a circuit diagram illustrating a domino logic circuit with a second stage domino circuit dynamic stage and a novel variable virtual ground circuit. The circuit of FIG. 2 has a first circuit dynamic stage 201 that receives inputs 1–n shown at 202 and the clock one signal 203, and which provides an output via a dynamic output node 204 to the first static stage. The static CMOS stage is here formed by p-channel transistor 205 and n-channel transistor 206, which form an inverter. The gates of each inverter transistor are connected to the dynamic output node 204, and the source of the p-channel transistor is connected to a first voltage source 208. The drain of the p-channel transistor 205 is connected to the static output node 207, which is also connected to the source of the n-channel transistor 206. The drain of transistor 206 is not connected directly to a second voltage source such as ground, as is the case in a typical domino logic circuit, but is instead connected to a novel circuit that is effectively operable to adjust the threshold voltage of the inverter circuit.

The static output node 207 of the static stage of the first domino logic circuit stage is connected to the input of a subsequent dynamic stage of domino logic 209. This dynamic stage typically will receive inputs from other circuits at inputs 210, and also receives a clock signal clock two shown at 211. Here, the clock two signal is derived from the clock one signal 203 by passing the clock one signal through two series inverters 212 and 213, providing an appropriate delay between clock one and clock two for the second domino circuit stage.

The second circuit dynamic stage 209 provides a dynamic output node signal 214, which is used by the novel variable virtual ground circuit. The second dynamic output signal 214 is fed into a feedback circuit 215 along with clock two signal 211. The output of the feedback circuit shown here is fed to a level converter 216, which supplies complementary outputs 217 and 218. Noninverted output 217 is supplied to the gate of transistor 222, and the inverted output 218 is connected to the gate of transistor 219. The drains of transistors 222 and 219 are connected to the source of inverter transistor 206 of the static stage of the first domino logic circuit, and serve to connect the static output circuit to a variable virtual ground signal. The source of transistor 222 is connected to ground 220, and the source of transistor 219 is connected to a voltage source 221.

In operation, the variable virtual ground signal provided to the inverter formed by transistors 205 and 206 is controlled by the dynamic output node signal of the subsequent domino logic stage. The goal of doing this is to underdrive the inputs of the second circuit's dynamic stage during the evaluation phase of the second domino stage. This reduces leakage current in the under-driven transistors, enabling use of relatively faster low threshold devices in the dynamic stage while retaining adequate noise immunity. When neither the clock two signal nor the dynamic stage output node of the second stage circuit are high, the output of the feedback logic 215 is high, and the inverter formed by transistors 205 and 206 sees ground 220 as the variable virtual ground signal. But, when the clock two and the dynamic output node of the second domino stage are high, the output of the feedback logic changes low, and the inverted output of the level converter 216 is high. This causes transistor 219 to turn on and transistor 222 to shut off, causing the ground seen by the inverter circuit formed by transistors 205 and 206 to be at the sub-ground voltage level at connection 221.

During the precharge phase of the second domino logic stage, the clk2 signal goes low forcing the output node to go high, restoring the variable virtual ground to a true zero volt ground level. Therefore, the evaluation of the next cycle is unaffected by a potential underdriving operation in the previous evaluation cycle.

Figure 3:
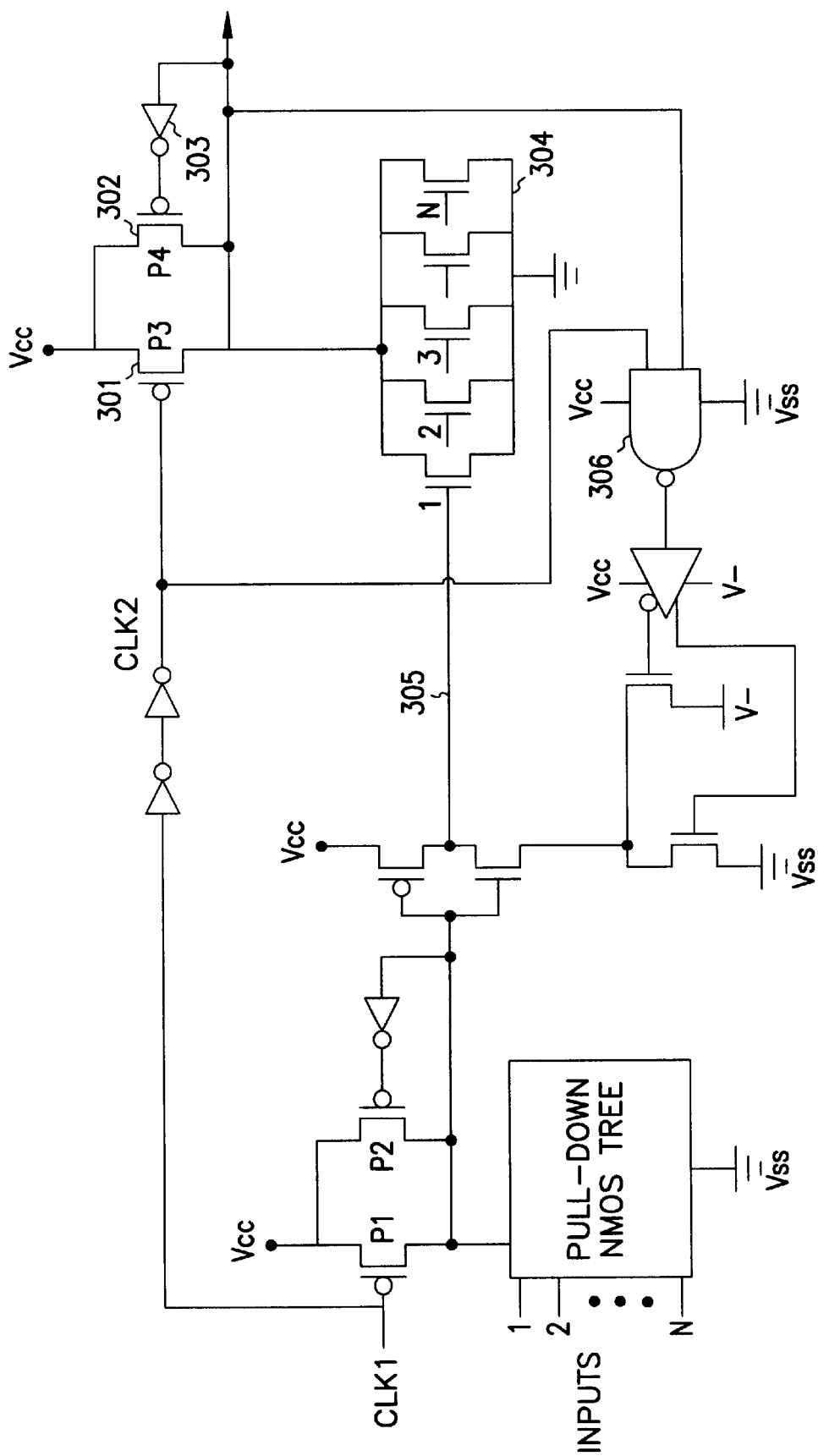
FIG. 3 shows a domino logic circuit with a novel static stage variable ground and a high fan-in OR gate in a second domino circuit stage, consistent with an embodiment of the present invention.

FIG. 3 shows one example embodiment of the invention in which the variable virtual ground is used to reduce leakage current during evaluation of a high fan-in OR gate. The circuit pictured is substantially the same as the circuit of FIG. 2, except that the dynamic stage of the second domino logic circuit is now shown as clock transistor 301, a level keeper circuit formed by level keeper transistor 302 and inverter 303, and a pull-down NMOS tree 304 that implements a high fan-in OR gate with transistors 1–n. The feedback logic for this particular embodiment of a wide OR gate comprises a NAND gate 306. If this circuit were implemented without the aid of the novel variable virtual ground circuit, the threshold of the OR gate transistors 1–n shown at 304 would have to be relatively high or the level keeper circuit would have to be made relatively strong to maintain noise immunity and to prevent leakage current from causing a false true reading from the gate. But, if the inputs 1–n are underdriven during the evaluation phase, relatively low threshold transistors can be used to form the OR gate shown at 304. The transistors are underdriven by the variable virtual ground as explained earlier, which provides a sub-ground voltage from the static output circuit output 305 when the subsequent domino stage is in the evaluation phase.

Research has shown that by establishing a V− voltage of −100 mV, underdriving low-threshold logic transistors in certain domino logic circuits can reduce leakage by up to eight times when compared with using only a ground signal. This greatly increases the noise immunity and robustness of the domino circuit, enabling an increase in gate speed of approximately 15% over domino circuits not utilizing the virtual variable ground. However, implementation of the circuit must take into account that the savings in leakage power must be balanced against the increased dynamic power consumed by the feedback circuit logic. It is anticipated that the increase in performance and the reduction in leakage current for some types of high fan-in gates will nonetheless make the present invention very beneficial to overall circuit performance.

Figure 4:
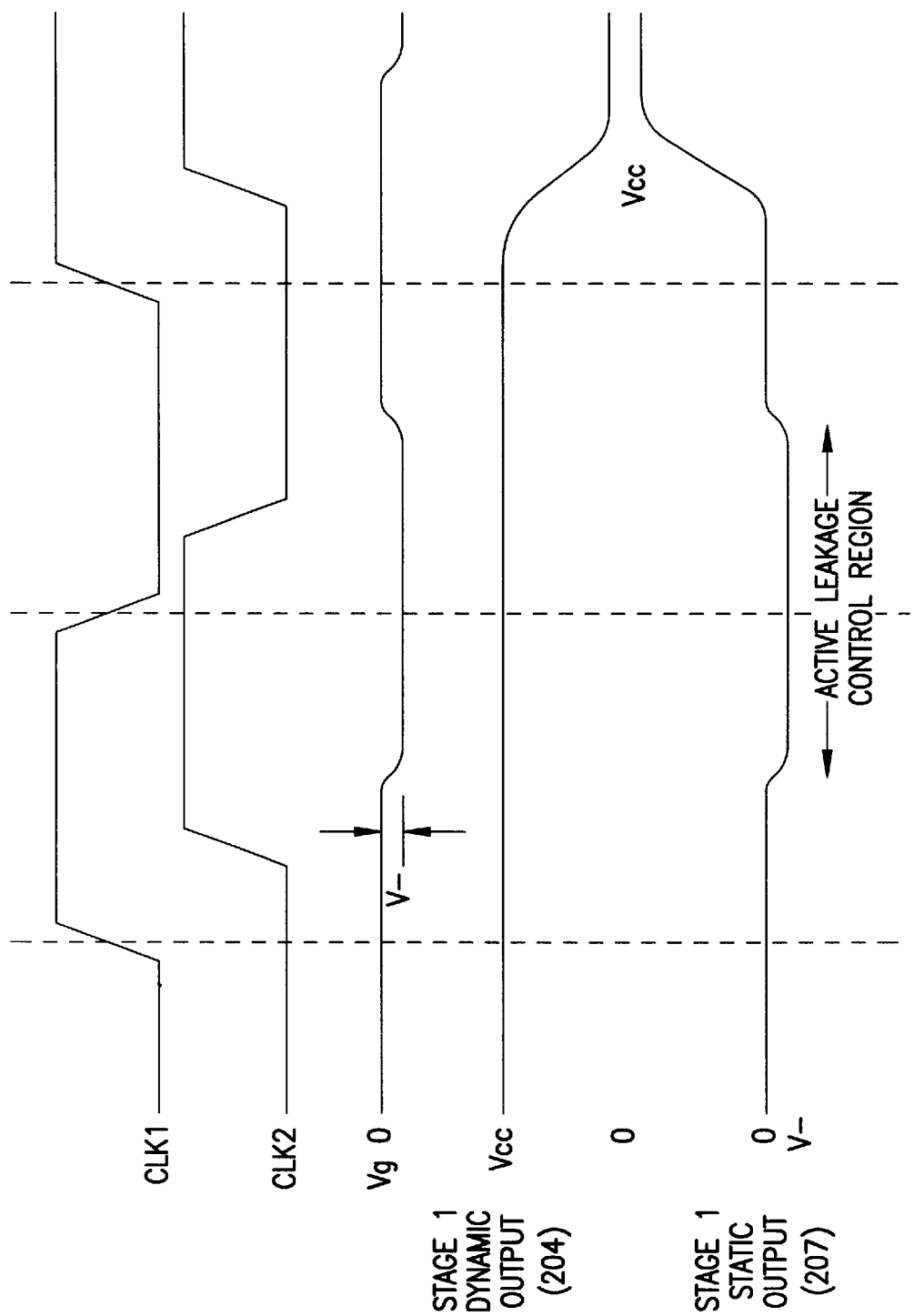
FIG. 4 shows a timing diagram, consistent with an embodiment of the present invention.

FIG. 4 is a timing diagram that illustrates how the variable virtual ground level Vg varies as the clock signal entering the second stage changes and causes the evaluation phase of the second stage domino logic circuit. The voltage change in the Vg signal during the active leakage control region represents the drop in the variable virtual ground from ground level to a voltage level that is approximately V−, as shown at 221 of FIG. 2 in situations where the stage 1 static output is at a zero or false signal value.

Figure 5:
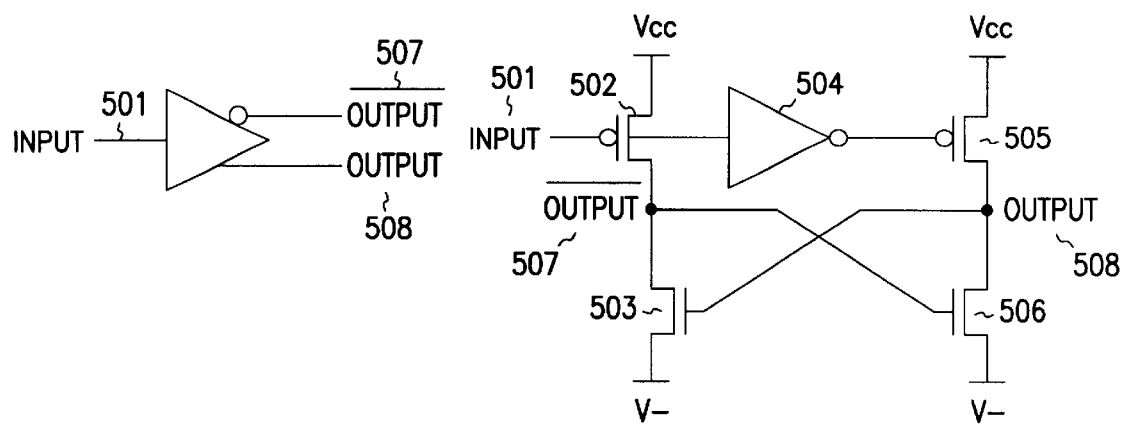
FIG. 5 shows a level converter circuit, as may be used in an embodiment of the present invention.

FIG. 5 illustrates one example embodiment of a level shifter circuit as may be used in the example domino logic circuits shown at 216 in FIG. 2 and in FIG. 3. The level shifter shown here essentially comprises two inverters receiving complementary inputs and having a virtual ground level at voltage V− shown at 221 of FIG. 2, which is lower than ground. The first inverter is formed by p-channel transistor 502 and n-channel transistor 503, and provides the inverted output signal 507 which is either at the approximate value of Vcc or V−. An inverter 504 inverts the input signal 501 and provides it to the second inverter formed by p-channel transistor 505 and n-channel transistor 506, which provide the level-shifted noninverted output 508, which is also switched between the approximate values V− and Vcc. Therefore, the level shifter receives the incoming signal from the NAND gate 215 of FIG. 3, and converts it from a signal at either Vcc or ground to a signal at either Vcc or V−, and additionally provides a complementary output signal.

The present invention provides an active leakage control system that can be used with high threshold pull-down tree transistors for increased robustness relative to low threshold circuits. The invention provides a drop-in solution that does not require changing timing plan or other circuit characteristics. No additional clock generation is required and the circuit provides low threshold performance with high threshold voltage robustness and noise immunity, enabling faster and more efficient operation of the domino logic circuit.

Although specific embodiments of the invention have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A method of operating a domino logic circuit comprising at least two series-connected domino logic stages with each domino logic stage comprising a dynamic stage and a static stage, the method comprising:

receiving from a second domino logic stage the output of the second domino logic stage's dynamic stage;

receiving a clock signal;

switching a variable virtual ground of the first domino logic stage's static stage to a voltage level below a circuit ground level when the received clock signal and the second domino logic stage's dynamic output are both high;

switching a variable virtual ground of the first domino logic stage's static stage to a circuit ground level when the received clock signal and the second domino logic stage's dynamic output are not both high.

2. The method of claim 1, wherein the received clock signal and the second domino logic stage's dynamic output both being high indicates that the second domino logic circuit is in an evaluation phase.

3. The method of claim 1, wherein the second domino logic stage's dynamic stage is a high fan-in NMOS pull-down tree.

4. The method of claim 3, wherein the high fan-in NMOS pull-down tree implements an OR gate.

5. The method of claim 3, wherein the high fan-in NMOS pull-down tree implements a NOR gate.

6. The method of claim 1, wherein the clock signal received for the second domino logic circuit stage is a delayed clock from the first domino logic circuit stage.

7. The method of claim 1, wherein the static output stage of the first domino logic stage is an inverter.

8. A domino logic circuit, comprising:

a first domino logic circuit dynamic stage comprising a pull-down circuit and a level keeper circuit, and receiving a first domino logic circuit clock signal and one or more inputs;

a first domino logic circuit static stage, which is connected to receive an input signal from an output of the first domino logic circuit dynamic stage;

a second domino logic circuit dynamic stage comprising a second pull-down circuit and a second level keeper circuit, and receiving a second domino logic circuit clock signal and one or more inputs, at least one of the one or more inputs being the output of the first domino logic circuit static stage;

a variable virtual ground circuit, the circuit receiving the second domino logic circuit clock signal and an output of the second domino logic circuit's dynamic stage, the variable virtual ground circuit operable to switch a variable virtual ground of the first domino logic stage's static stage to a low voltage level below a circuit ground level during an evaluation phase of the second domino logic circuit.

9. The domino logic circuit of claim 8, wherein the evaluation phase of the second domino logic circuit occurs when the received clock signal and the second domino logic stage's dynamic output are both high.

10. The domino logic circuit of claim 8, wherein the variable virtual ground of the first domino logic stage's static stage is switched to a circuit ground level when the second domino logic circuit is not in the evaluation phase.

11. The domino logic circuit of claim 8, wherein the first domino logic circuit pull-down circuit comprises an NMOS pull-down tree.

12. The domino logic circuit of claim 8, wherein the second domino logic circuit pull-down circuit comprises OR gate logic.

13. The domino logic circuit of claim 8, wherein the second domino logic circuit pull-down circuit comprises NOR gate logic.

14. The domino logic circuit of claim 8, wherein the first domino logic circuit static stage comprises an inverter.

15. The domino logic circuit of claim 8, wherein the second domino logic circuit clock signal is a delayed first domino logic clock signal.

16. The domino logic circuit of claim 15, wherein the first domino logic circuit clock is delayed to create the second domino logic circuit clock by connecting two series inverters to the first domino logic circuit clock, the output of the series inverters comprising the second domino logic circuit clock signal.

17. The domino logic circuit of claim 8, wherein the variable virtual ground circuit comprises:

a NAND gate, the inputs of the NAND gate coupled to receive the second domino logic circuit clock signal and the second domino logic circuit's dynamic stage output;

an level shifter, the level shifter coupled to receive an output from the NAND gate;

a first transistor coupled between the virtual ground connection of the static output stage of the first domino logic circuit stage and a negative voltage level, the gate of the first transistor coupled to a complementary output of the level shifter; and a second transistor coupled between the virtual ground connection of the static output stage of the first domino logic circuit stage and ground, the gate of the second transistor coupled to receive a noninverted output of the level shifter.

18. The domino logic circuit of claim 17, the inverter comprising a level-shifter circuit providing an inverted and a noninverted output of either a high voltage level or the low voltage level below the circuit ground level.

19. The domino logic circuit of claim 17, wherein the gate of the second transistor is coupled to receive the output signal of the NAND gate by a level-shifter circuit providing a noninverted output of either a high voltage level or the low voltage level below the circuit ground level.

20. An integrated circuit comprising at least one domino logic circuit, the at least one domino logic circuit comprising:

a first domino logic circuit dynamic stage comprising a pull-down circuit and a level keeper circuit, and receiving a first domino logic circuit clock signal and one or more inputs;

a first domino logic circuit static stage, which is connected to receive an input signal from an output of the first domino logic circuit dynamic stage;

a second domino logic circuit dynamic stage comprising a second pull-down circuit and a second level keeper circuit, and receiving a second domino logic circuit clock signal and one or more inputs, at least one of the one or more inputs being the output of the first domino logic circuit static stage;

a variable virtual ground circuit, the circuit receiving the second domino logic circuit clock signal and an output of the second domino logic circuit's dynamic stage, the variable virtual ground circuit operable to switch a variable virtual ground of the first domino logic stage's static stage to a low voltage level below a circuit ground level during an evaluation phase of the second domino logic circuit.

21. The integrated circuit of claim 20, wherein the integrated circuit is a processor.

22. The integrated circuit of claim 20, wherein the variable virtual ground circuit comprises:

a NAND gate, the inputs of the NAND gate coupled to receive the second domino logic circuit clock signal and the second domino logic circuit's dynamic stage output;

an level shifter, the level shifter coupled to receive an output from the NAND gate;

a first transistor coupled between the virtual ground connection of the static output stage of the first domino logic circuit stage and a negative voltage level, the gate of the first transistor coupled to an inverted output of the level shifter; and a second transistor coupled between the virtual ground connection of the static output stage of the first domino logic circuit stage and ground, the gate of the second transistor coupled to receive a noninverted output of the level shifter.

* * * * *